US005183419A

United States Patent [19]

Dewar

[11] Patent Number: 5,183,419

[45] Date of Patent: Feb. 2, 1993

[54] BATTERY TERMINAL CONNECTOR

[75] Inventor: John H. Dewar, Grosse Ile, Mich.

[73] Assignee: United Technologies Automotive, Inc., Dearborn, Mich.

[21] Appl. No.: 632,296

[22] Filed: Dec. 21, 1990

[51] Int. Cl.[5] .................... H10R 11/26

[52] U.S. Cl. .................... 439/765; 439/388; 439/762; 439/813

[58] Field of Search .................... 439/754, 756, 762–771, 439/801, 805, 813, 388

[56] References Cited

U.S. PATENT DOCUMENTS

D. 249,944 10/1978 Smith .................... D13/24
D. 284,184 6/1986 Carey et al. .................... D13/10
1,661,375 3/1928 Leighton .................... 439/762
1,667,581 4/1928 Bailey .................... 439/775
1,676,387 7/1928 De Lorme .................... 439/762
1,691,079 11/1928 Nightingale .................... 439/756
1,813,829 7/1931 Vaccaro .................... 439/758
1,837,814 12/1931 Grunwald .................... 439/758
1,914,998 6/1933 Looker .................... 439/758
1,920,608 8/1933 Thompson .................... 173/259
1,921,840 8/1933 Recen .................... 173/259
1,960,593 5/1934 Olson .................... 173/259
2,077,522 4/1937 Heatwole .................... 173/259
2,195,900 4/1940 Orahood ete al. .................... 173/259
2,222,577 11/1940 Thompson .................... 173/259
2,357,567 9/1944 Williams .................... 439/388
2,360,974 10/1944 Perreca .................... 173/259
2,434,398 1/1948 Daellenbach .................... 173/259
2,462,453 2/1949 Akin .................... 173/259
2,602,105 7/1952 Welch et al. .................... 173/259
2,751,571 6/1956 Colyer .................... 339/228
2,769,964 11/1956 Lartz .................... 339/226
2,846,660 8/1958 Bogardus, Sr. .................... 339/225
2,865,012 12/1958 Black .................... 339/228
2,962,689 11/1960 Johnson et al. .................... 339/95
3,000,998 9/1961 Wiora .................... 136/135
3,004,239 10/1961 Devino .................... 339/226
3,383,646 5/1968 Otto .................... 339/226
3,389,368 6/1968 Schaefer .................... 339/116
3,568,138 3/1971 Bakker .................... 339/230
3,568,139 3/1971 Delzer .................... 339/239
3,704,440 11/1972 Bradley .................... 339/114
3,918,787 11/1975 Hays .................... 339/19
3,963,303 6/1976 Hays .................... 339/237
3,980,387 9/1976 Neidecker .................... 339/228
4,054,355 10/1977 Kourimsky et al. .................... 339/230
4,062,613 12/1977 Tritenne .................... 339/95 B
4,063,794 12/1977 Dittmann .................... 339/230
4,099,827 7/1978 Webster .................... 339/228
4,294,505 10/1981 Gaffney .................... 339/231
4,354,726 10/1982 Kato et al. .................... 339/230
4,372,636 2/1983 Dufresne .................... 339/237
4,380,291 4/1983 Shannon .................... 206/343
4,455,059 6/1984 Theiler .................... 339/224
4,464,008 8/1984 Andersson et al. .................... 339/226
4,560,629 12/1985 Woodhouse .................... 429/184
4,747,793 5/1988 Fukuda et al. .................... 439/766

FOREIGN PATENT DOCUMENTS 1288001 9/1972 United Kingdom .
2048578 12/1980 United Kingdom .................... 439/762
2054984 2/1981 United Kingdom .

*Primary Examiner*—Paula A. Bradley
*Attorney, Agent, or Firm*—Ronald G. Cummings

[57] ABSTRACT

A stamped metal battery post connector having a base portion for crimped connection to an electrical conductor and an integral contact portion for engaging a battery post with the contact portion having a first wall member with a first post-receiving aperture, a second wall member with a second post-receiving aperture and a threaded connector for drawing the first wall member toward the second wall member to clamp the connector to the battery post. The first and second post-receiving apertures are each formed with an annular surface having coined recesses to grippingly engage and penetrate the battery post to inhibit angular rotation.

19 Claims, 2 Drawing Sheets

BATTERY TERMINAL CONNECTOR

TECHNICAL FIELD

This invention relates to terminal connectors for storage batteries and more particularly to a stamped metal battery post connector for automobile storage batteries and the like.

BACKGROUND AND SUMMARY OF THE INVENTION

Storage batteries of the type used in automobiles, trucks and the like generally have terminal posts made of lead alloy material with a cylindrical or frusta-conical shape. A conventional connector used with such battery posts is a molded, generally U-shaped device with a bolt passing through the outwardly projecting yoke-like arms for securely clamping the connector to the battery post. Exemplary connectors are shown in Waltz, U.S. Pat. No. 1,808,330, Haegert, U.S. Pat. No. Reissue 26,486 and Anderson, U.S. Pat. No. 2,713,155. Such connectors are generally die cast from lead or brass-lead alloy or other materials such as zinc alloy or copper alloy.

Another type of connector is a stamped metal battery terminal connector which is fabricated from sheet metal. Exemplary stamped metal connectors are shown in Kato et al., U.S. Pat. No. 4,354,726, Kourimsky et al., U.S. Pat. No. 4,054,355 and Bakker, U.S. Pat. No. 3,568,138 which are incorporated herein by reference. Stamped terminal connectors are generally preferable where weight reduction is a major consideration.

In such connectors, it is desirable to achieve a secure mechanical connection which resists angular rotation and maintains good electrical continuity with the battery post.

Accordingly, it is an object of the present invention to provide a new and improved stamped metal connector which achieves good mechanical and electrical connection to the battery post with enhanced resistance to rotation and slippage.

Another object of the invention is to provide such a connector which affords easy and convenient connection and disconnection from the battery post.

A further object of the invention is to provide such a connector which can be utilized interchangeably in right hand and left hand terminal configurations.

A still further object of the invention is to provide such a stamped metal terminal connector which is cost efficient to manufacture and durable in use.

It has been found that the foregoing and related objects are attained in stamped metal connector having a base portion for attachment to an electrical conductor and a contact portion for engaging a battery post. The contact portion has a first wall member with a first post-receiving aperture and a spaced second wall member with a second post-receiving aperture in alignment with the first aperture for receiving a battery post therethrough. The first and second wall members are interconnected by means for drawing the wall members together so as to clamp the connector to the battery post.

The first and second apertures are each defined by an inner surface in the respective wall member which is adapted to grippingly engage a battery post terminal to inhibit angular rotation of the connector. In a preferred embodiment, the inner surface includes a coined pattern configured and disposed to penetrate the battery post for good electrical contact and enhanced resistance to rotation. When the connector is clamped to the battery post, the inner surfaces of the first and second apertures engage the battery post in nonparallel disposition to each other and nonorthogonal orientation to the central axis of the battery post for enhanced resistance to angular rotation.

DESCRIPTION OF THE PREFERRED EMBODIMENT

Figure 1:
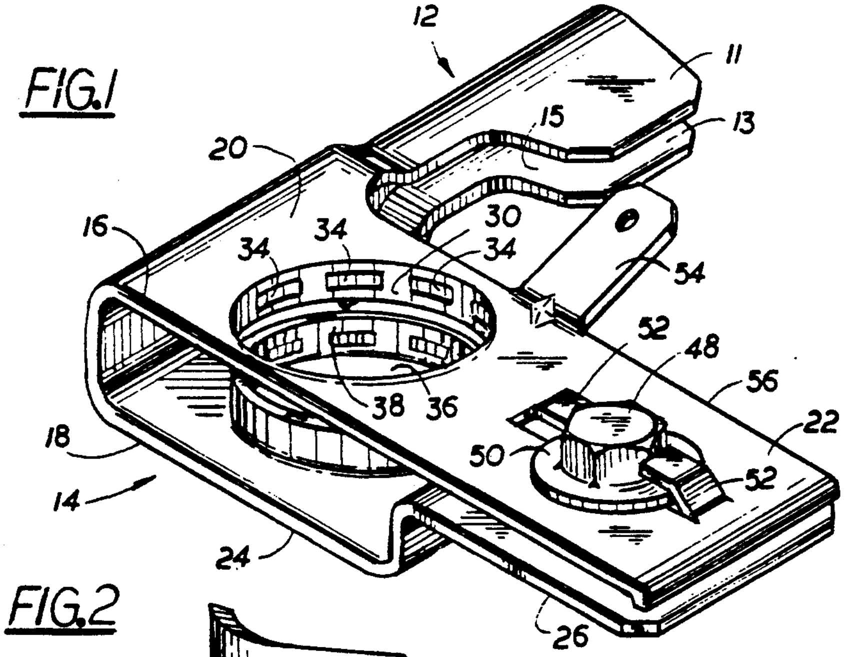
FIG. 1 is a perspective view of the battery post connector of the present invention.

Although specific forms of the present invention have been selected for illustration in the drawings, and the following description is drawn in specific terms for the purpose of describing these forms of the invention, the description is not intended to limit the scope of the invention which is defined in the appended claims.

Figure 3:
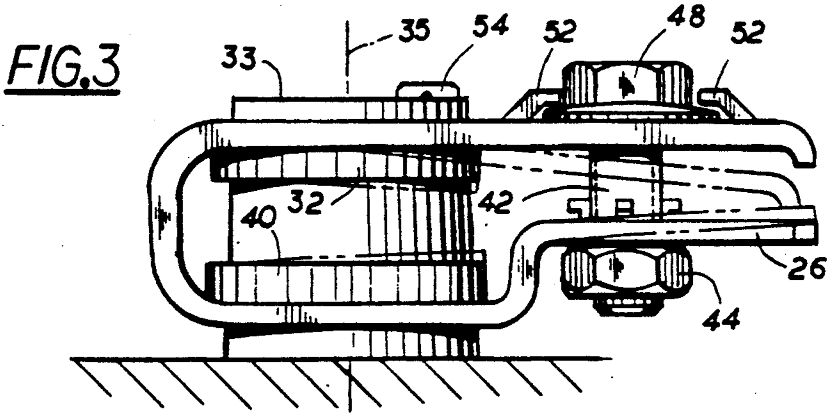
FIG. 3 is a front view of the connector mounted to a battery post with the connector in the clamped position shown in broken line.

Referring to the drawings, FIG. 1 shows the battery terminal connector of the present invention in an open position ready for mounting on a battery post. FIG. 3 shows the connector (in solid line) in an open, unclamped position mounted on a battery post and in a closed position (in broken line) clamped to the battery post.

Referring initially to FIG. 1, the connector of the present invention generally comprises a base portion 12 for attachment to an electrical conductor such as a battery lead in an automobile and a contact portion 14 for engaging the terminal post of an automobile battery.

The base portion 12 has opposed projections 11, 13 spaced apart to form a channel 15 therebetween to receive an electrical conductor. The projections 11, 13 are adapted to be folded over to form a crimp connection to an electrical conductor (not shown). Alternately, the electrical conductor can be secured to the connector by mechanical means, soldering, brazing or the like.

The contact portion 14 has an upper wall member 16 and a spaced opposing lower wall member 18. For purposes of explanation, the upper wall member 16 is divided into an inner or proximal section 20 and an outer or distal section 22. Similarly, the lower wall member 18 is divided into an inner section 24 and an outer section 26. As best seen in FIG. 3, the outer section 26 is stepped relative to the inner section 24.

Figure 2:
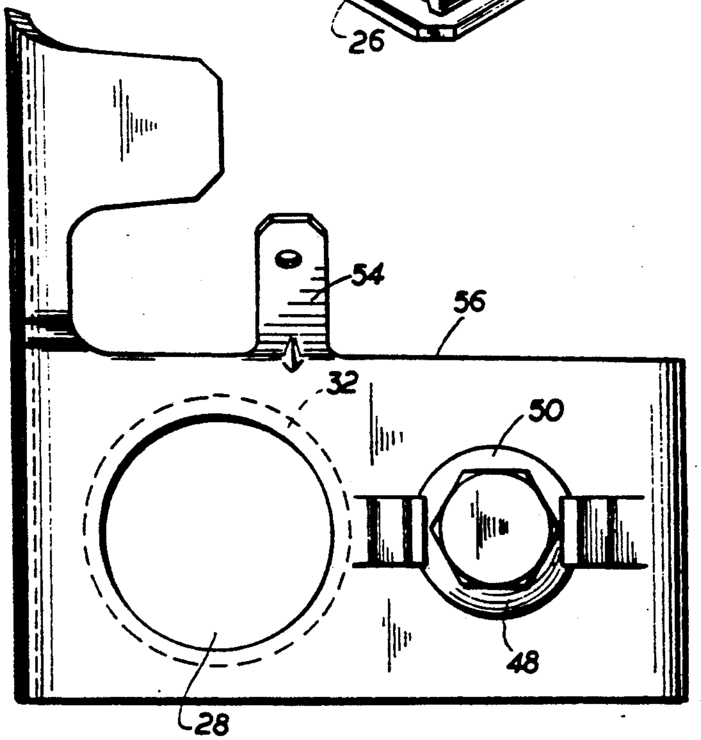
FIG. 2 is a top view of the connector of FIG. 1.

The section 20 of the upper wall member 16 has a post-receiving aperture 28 (FIG. 2). The aperture 28 is an extruded circular aperture with the aperture being defined by the inner wall surface 30 (FIG. 1) of the extruded wall portion 32. The extruded wall portion 32 is generally orthogonal to the wall member 16 and extends downwardly toward the lower wall member 18. The inner wall surface 30 has a coined pattern for penetrating and grippingly engaging the battery post. Coining is a known technique which will produce recesses with defined edges in the inner wall without removing wall material. In the illustrated embodiment, the coined pattern comprises a plurality of spaced, coined rectangular recesses 34 extending along the annular wall surface 30. Similarly, the section 24 of the lower wall member 18 has an extruded, post-receiving circular aperture 36 and the extruded wall portion 40 is generally orthogonal to the wall member 18 and extends upwardly toward the upper wall member 16. The aperture 36 is similarly defined by an inner wall surface 38 which has a coined pattern of rectangular recesses for penetrating and grippingly engaging the battery post. In the open position as shown in FIG. 1, the plane of the upper aperture 28 is approximately parallel to the plane of the lower aperture 36. The apertures 28, 36 are dimensioned for a snug fit on the battery post 33 when the connector is placed on the battery post in the open position (FIG. 3) prior to clamping.

Referring to FIG. 3, a threaded connector is utilized for drawing together the wall members 16, 18 for purposes of clamping the connector to the battery post 33. The outer sections 22, 26 of wall members 16, 18 respectively have aligned apertures (not shown) which receive the bolt 42 in generally parallel disposition to the central axis 35 of the battery post 33. The head 48 of bolt 42 has an outer flange portion 50. The outer section 22 has tabs 52 formed adjacent the bolt aperture to engage the flange portion 50 to retain the bolt 42 adjacent the outer section 22 while allowing angular rotation. A nut 44 is rigidly secured to the outer section 26 by staking.

Clockwise rotation of bolt head 48 will draw the wall members 16, 18 together to clamp the connector to the battery post. Since the bolt head 48 is trapped to the wall member 16 and the nut 44 is secured to the wall member 18, counterclockwise rotation of the bolt head 48 will mechanically draw the wall members 16, 18 apart to the open position for ease of removal from the battery post. This mechanical opening feature affords easy and convenient disconnection of the connector from the battery post. Alternately, the nut 44 may be secured to the outer section 26 by welding or other means or it may be replaced by an extruded threaded aperture. Other types of mechanical means may be utilized for drawing the wall members 16, 18 together.

An auxiliary connector terminal 54 is integrally formed with the upper wall member 16 so as to extend outwardly and upwardly from the side 56 of the wall member 16. The terminal 54 provides an auxiliary connection terminal on the battery post connector for connection of an auxiliary electrical lead. Such an auxiliary terminal may be used for optional circuits not accommodated in the basic power distribution system or for appliances or equipment that may require quick and easy disconnection from the battery without the necessity for removing the connector from the battery post. In the illustrated embodiment, the terminal 54 is configured as a tab terminal adapted to be detachably engaged by a mating clip terminal mounted to a conductor wire. Other forms of auxiliary terminals may also be utilized.

In connecting the connector of the present invention to a battery post, the connector is first placed on the battery post 33 in the open position. The wall members 16, 18 are substantially parallel as shown in FIG. 3 and the battery post 33 extends through the respective apertures 36, 28 in a relatively snug fitting relationship. In the open position, the respective planes of the apertures 28, 36 are substantially parallel and are disposed substantially orthogonal to the central axis 35 of the battery post 33.

To securely clamp the connector to the battery post 33, bolt 42 is rotated clockwise to draw the wall members 16, 18 together to the closed (clamped) position shown in broken line in FIG. 3. Drawing the wall members 16, 18 together causes the circular apertures 28, 36 to assume a noncircular shape (i.e., slightly oval) with the inner wall surfaces 30, 38 engaging the battery terminal 33 to securely clamp the connector to the battery post. In the closed position, the apertures 28, 36 and the respective coined surfaces are nonparallel to each other and are in a nonorthogonal orientation to the central axis 35 as shown in FIG. 3. The edges of the coined recesses 34 penetrate the battery terminal 33 such that the material of the battery post 33 will enter the recesses 34 to provide good electrical continuity with the connector. The planes of the respective coined patterns are at a nonorthogonal angle relative to the central axis 35 to provide enhanced resistance to angular rotation. It is believed that the nonorthogonal orientation of the coined pattern significantly increases the resistance to angular rotation.

Figure 5:
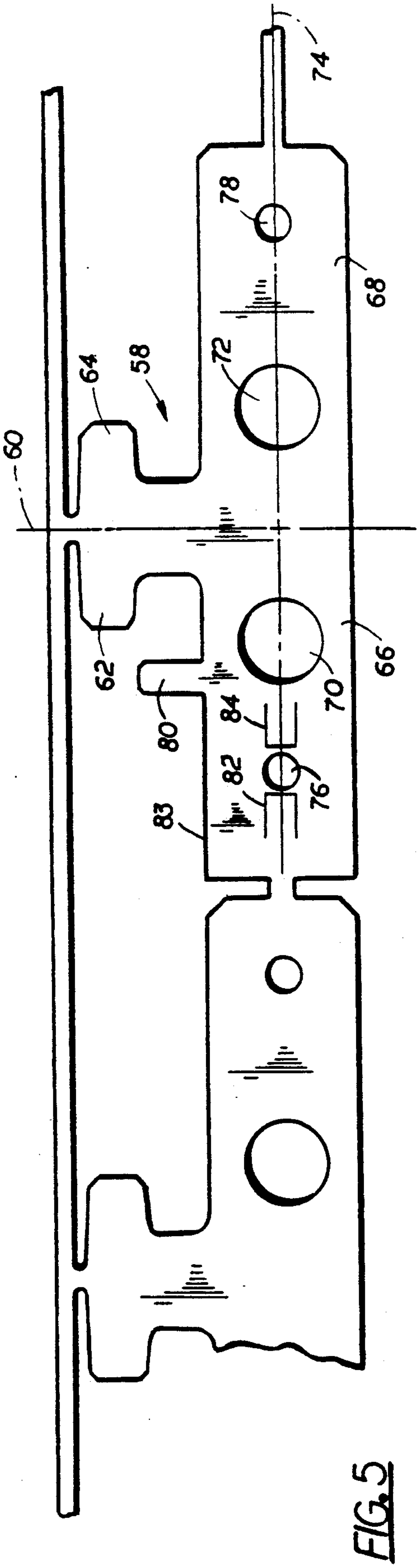
FIG. 5 shows a blanked strip for forming the connector of FIG. 1.
Figure 4:
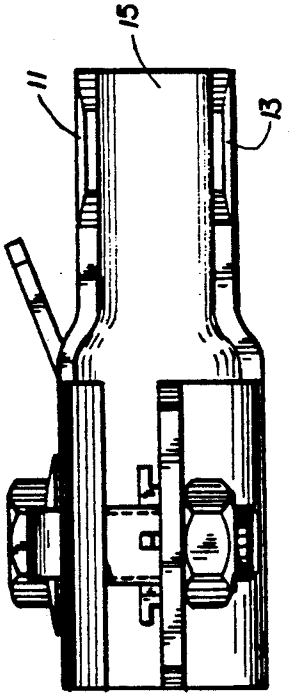
FIG. 4 is a right view of the connector of FIG. 1.

As can be seen, the connector of the present invention is formed from a single piece of sheet metal except for the bolt 42 and nut 44. The blank for the connector stamped from sheet metal is shown in FIG. 5. The blank comprises a trunk 58 having a central axis 60 extending between its opposite ends. A pair of oppositely disposed tabs 62, 64 are formed at one end of the trunk 58 and extend outwardly transverse to the central axis 60. The tabs 62, 64 are subsequently bent to form the projections 11, 13 of base portion 12.

A pair of tabs 66, 68 are oppositely disposed at the other end of trunk 58 and extend outwardly transverse to the central axis 60. Apertures 70, 72 in tabs 66, 68 respectively are position equidistant from the central axis 60 along a common line 74. The apertures 70, 72 will subsequently be extruded and coined with recesses 34 to form the bolt receiving apertures 28, 36.

The tabs 66, 68 also contain apertures 76, 78 respectively which are equidistant from the central axis 60 on the common line 74. The aperture 76 will receive the bolt 42 and the nut 44 will be staked in the aperture 78. Partial rectangular cuts 82, 84 are located on opposite sides of the aperture 76 for ultimately forming the tabs 52 for capturing the flange 50 of bolt head 48. Projection 80 extends on the inner side 83 of tab 66 generally parallel to the central axis 60. Projection 80 ultimately forms the auxiliary terminal 54. A preferred material for the connector is C260 cartridge brass with a tin plate finish.

As can be seen, a stamped metal connector has been described which achieves good mechanical and electrical connection to the battery post with enhanced resistance to rotation and slippage. The connector affords easy and convenient disconnection from the battery post by rotation of the bolt for automatic mechanical opening of the connector. Furthermore, since the clamping bolt is vertically disposed (rather than horizontally) with the bolt head located at the top of the connector, the bolt is conveniently accessible for connection and disconnection even when the battery is located in crowded spaces. Moreover, the vertical orientation of the bolt renders the connector interchangeable in right hand and left hand terminal configurations for universal application.

As will be apparent to persons skilled in the art, various modifications and adaptations of the structure above described will become readily apparent without departure from the spirit and scope of the invention, the scope of which is defined in the appended claims.

I claim:

1. A battery post connector comprising a base portion for attachment to an electrical conductor, a contact portion for engaging a battery post, said contact portion comprising a first wall member having a first aperture for receiving a battery post, said first aperture being in a first plane, and, a second wall member having a second aperture for receiving a battery post, said second aperture being in a second plane, said second wall member being spaced from said first wall member with said first and second apertures being aligned for receiving a battery post therethrough, and means for drawing said first wall member said second wall member to clamp the battery post connector to a battery post, said first and second planes being in nonparallel disposition when said first wall member is drawn toward said second wall member to clamp the battery post connector to a battery post.

2. The device of claim 1 wherein said means for drawing said first wall member toward said second wall member comprises threaded connector means for drawing together said first and second wall members when said connector means is rotated in one of two angular directions and for drawing apart said first and second wall members when said connector means is rotated in the other of said two angular directions.

3. The device of claim 1 wherein said base portion and said contact portion are stamped metal construction.

4. The device of claim 3 wherein said base portion and said contact portion are of integral, unitary construction.

5. The device of claim 1 wherein said first aperture in said first wall member is defined by a first inner surface adapted to grippingly engage a battery post terminal to inhibit angular rotation of the battery post connector about the battery post.

6. The device of claim 5 wherein said inner surface is configured to penetrate said battery post.

7. The device of claim 5 wherein said first and second inner surfaces are configured to penetrate said battery post.

8. The device of claim 5 wherein said inner surface comprises a coined pattern.

9. The device of claim 8 wherein said pattern comprises a plurality of coined rectangular recesses.

10. The device of claim 5 wherein said second aperture in said second wall member is defined by a second inner surface adapted to grippingly engage a battery post terminal to inhibit angular rotation of the battery post connector about the battery post.

11. The device of claim 11 wherein a battery post has a central axis and said first and said second inner surfaces engage said battery post in a nonorthogonal orientation to said central axis when the battery post connector is clamped to said battery post.

12. The device of claim 10 wherein said first aperture in said first wall member is extruded so that said first inner surface extends outwardly from said first wall member and said second aperture in said second wall member is extruded so that said second inner surface extends outwardly from said second wall member.

13. The device of claim 5 wherein said first and second inner surfaces each comprise a coined pattern.

14. The device of claim 13 wherein each said pattern comprises a plurality of coined rectangular recesses.

15. A blank for a terminal connector stamped from sheet metal comprising, a trunk portion having a central axis extending between first and second opposite ends, first and second tabs at said first end being oppositely disposed and extending transverse to said central axis, said first and second tabs being adapted for forming a crimp connection to an electrical conductor, third and fourth tabs at said second end being oppositely disposed and extending transverse to said central axis, each said third and fourth tabs having a post-receiving aperture equispaced from said central axis on a common line transverse to said central axis, and each said third and fourth tabs having a fastener aperture equispaced from said central axis on said line transverse to said central axis.

16. A battery post connector comprising a base portion for attachment to an electrical conductor, a contact portion for engaging a battery post, said base portion and said contact portion being integrally formed stamped metal construction, said contact portion comprising a first wall member having a first aperture for receiving a battery post, and, a second wall member having a second aperture for receiving a battery post, said second wall member being spaced from said first wall member with said first and second apertures being aligned for receiving a battery post therethrough, and means for drawing said first wall member toward said second wall member to clamp the battery post connector to a battery post.

17. A battery post connector comprising a base portion for attachment to an electrical conductor, a contact portion for engaging a battery post having a central axis, said contact portion comprising a first wall member having a first aperture for receiving a battery post, said first aperture being in a first plane and being defined by a first inner surface adapted to grippingly engage a battery post terminal to inhibit angular rotation of the battery post connector about the battery post, and a second wall member having a second aperture for receiving a battery post, said second aperture being in a second plane, said second wall member being spaced from said first wall member with said first and second apertures being aligned for receiving a battery post therethrough, and means for drawing said first wall member toward said second wall member to clamp the battery post connector to a battery post, said first and second planes being in nonparallel disposition when said first wall member is drawing toward said second wall member to clamp the battery post connector to a battery post and said first plane being in a nonorthogonal orientation to said central axis with said first inner surface engaging said battery post when the battery post connector is clamped to said battery post.

18. A battery post connector comprising a base portion for attachment to an electrical conductor, a contact portion for engaging a battery post, said contact portion comprising a first wall member having a first aperture for receiving a battery post, said first aperture being in a first plane, said first aperture in said first wall member being defined by a first inner surface adapted to grippingly engage a battery post terminal to inhibit angular rotation of the battery post connector about he battery post and being extruded so that said inner surface extends outwardly form said first wall member, and a second wall member having a second aperture for receiving a battery post, said second aperture being in a second plane, said second wall member being spaced from said first wall member with sad first and second apertures being aligned for receiving a battery post therethrough, and mean for drawing said first wall member toward said second wall member to clamp the battery sot connector to a battery post, said first and second planes being in nonparallel disposition when said first wall member is drain toward said second wall member to clamp the battery post connector to a battery post.

19. A battery post connector comprising a base portion for attachment to an electrical conductor, a contact portion for engaging a battery post, said contact portion comprising a first wall member having a first aperture for receiving a battery post, said first aperture being in a first plane, and, a second wall member having a second aperture for receiving a battery post, said second aperture being in a second plane, said second wall member being spaced from said first wall member with said first and second apertures being aligned for receiving a battery post therethrough, and means for drawing said first wall member toward said second wall member to clamp the battery post connector to a battery post, said first and second planes being in nonparallel disposition when said first wall member is drawn toward said second wall member to clamp the battery post connector to a battery post, said means for drawing comprising threaded connector means for drawing together said first and second wall members when said connector means in rotated in one of two angular directions and for drawing apart said first and second wall members when said connector means is rotated in the other of said two angular directions, said threaded connector means having a central axis substantially parallel to the central axis of a battery post extending though said first and second apertures.

* * * * *

UNITED STATES PATENT AND TRADEMARK OFFICE

CERTIFICATE OF CORRECTION

PATENT NO. : 5,183,419

DATED : February 2, 1993

INVENTOR(S) : John H. Dewar

It is certified that error appears in the above-identified patent and that said Letters Patent is hereby corrected as shown below:

Col. 5, line 18, after "member" insert --toward--.

Col. 6, line 62, "drawing" should be --drawn--.

Col. 7, line 21, "sad" should be --said--.

Col. 7, line 22, "mean" should be --means--.

Col. 7, line 24, "sot" should be --post--.

Col. 8, line 23, "in" should be --is--.

Signed and Sealed this

Ninth Day of November, 1993

Attest:

Bruce Lehman

BRUCE LEHMAN

*Attesting Officer* *Commissioner of Patents and Trademarks*